United States Patent
Feng et al.

(10) Patent No.: US 8,500,916 B2
(45) Date of Patent: Aug. 6, 2013

(54) METHOD FOR ALIGNING WAFERS WITHIN WAFER PROCESSING EQUIPMENT

(75) Inventors: Jian-Huei Feng, San Jose, CA (US); Hung-Chin Guthrie, Saratoga, CA (US); Quang Le, San Jose, CA (US); James Nystrom, Sunnyvale, CA (US)

(73) Assignee: HGST Netherlands B.V., Amsterdam (NL)

( * ) Notice: Subject to any disclaimer, the term of this patent is extended or adjusted under 35 U.S.C. 154(b) by 1635 days.

(21) Appl. No.: 10/982,029

(22) Filed: Nov. 5, 2004

(65) Prior Publication Data

US 2006/0096612 A1    May 11, 2006

(51) Int. Cl.
*B08B 3/00* (2006.01)
(52) U.S. Cl.
USPC ............. 134/36; 134/34; 134/42; 134/198; 134/199; 156/345.55
(58) Field of Classification Search
USPC .......................................... 134/1, 2, 34, 94.1
See application file for complete search history.

(56) References Cited

U.S. PATENT DOCUMENTS

| | | | |
|---|---|---|---|
| 5,692,878 A | 12/1997 | Freund | |
| 5,743,706 A | 4/1998 | Happ et al. | |
| 6,102,057 A | 8/2000 | Vogtmann et al. | |
| 6,283,827 B1 | 9/2001 | Vogtmann et al. | |
| 6,672,358 B2 | 1/2004 | Yanagita et al. | |
| 6,702,202 B1 | 3/2004 | Boyd et al. | |
| 6,710,886 B2 | 3/2004 | Park et al. | |
| 7,032,758 B2 | 4/2006 | Pai et al. | |
| 2002/0189638 A1* | 12/2002 | Luscher et al. | 134/1.3 |

FOREIGN PATENT DOCUMENTS

| | | |
|---|---|---|
| JP | 63178531 | 7/1988 |
| JP | 1-173940 U | 12/1988 |
| JP | 8330383 | 12/1996 |
| JP | 11026551 | 1/1999 |
| JP | 2002361186 | 12/2002 |
| JP | 2003031537 | 1/2003 |

* cited by examiner

*Primary Examiner* — Nicole Blan

(57) ABSTRACT

Systems and methods for aligning wafers within wafer processing equipment. In a first embodiment, a wafer alignment nozzle comprises a fixed cylindrical member. A moveable cylindrical member is disposed with the fixed cylindrical member in a sliding fit. The moveable cylindrical member comprises a plurality of angled fluid orifices for directing a plurality of streams of the fluid onto a surface of the wafer.

5 Claims, 4 Drawing Sheets

METHOD FOR ALIGNING WAFERS WITHIN WAFER PROCESSING EQUIPMENT

TECHNICAL FIELD

Embodiments of the present invention relate to the fields of manufacturing semiconductors and hard disk drives, and more particularly to systems and methods for aligning wafers within wafer processing equipment as utilized in the manufacture of semiconductors and hard disk drives.

RELATED CASE

U.S. Pat. No. 6,131,589 to Vogtmann and Lentz, is hereby incorporated herein by reference in its entirety as background material.

BACKGROUND ART

Hard disk drives are used in almost all computer system operations. In fact, most computing systems are not operational without some type of hard disk drive to store the most basic computing information such as the boot operation, the operating system, the applications, and the like. In general, the hard disk drive is a device which may or may not be removable, but without which the computing system will generally not operate.

The basic hard disk drive model was established approximately 40 years ago and resembles a phonograph. That is, the hard drive model includes a plurality of storage disks or hard disks vertically aligned about a central core that spin at a standard rotational speed. A plurality of magnetic read/write transducer heads, for example, one head per surface of a disk, is mounted on the actuator arm. The actuator arm is utilized to reach out over the disk to or from a location on the disk where information is stored. The complete assembly, e.g., the arm and head, is known as a head gimbal assembly (HGA).

In operation, the plurality of hard disks is rotated at a set speed via a spindle motor assembly having a central drive hub. Additionally, there are channels or tracks evenly spaced at known intervals across the disks. When a request for a read of a specific portion or track is received, the hard disk drive aligns a head, via the arm, over the specific track location and the head reads the information from the disk. In the same manner, when a request for a write of a specific portion or track is received, the hard disk drive aligns a head, via the arm, over the specific track location and the head writes the information to the disk.

Over the years, refinements of the disk and the head have provided great reductions in the size of the hard disk drive. For example, the original hard disk drive had a disk diameter of 24 inches. Modern hard disk drives are generally much smaller and include disk diameters of less than 2.5 inches (micro drives are significantly smaller than that). Refinements also include the use of smaller components and laser advances within the head portion. That is, by reducing the read/write tolerances of the head portion, the tracks on the disk can be reduced in size by the same margin. Thus, as modern laser and other micro recognition technology are applied to the head, the track size on the disk can be further compressed.

A second refinement to the hard disk drive is the increased efficiency and reduced size of the spindle motor spinning the disk. That is, as technology has reduced motor size and power draw for small motors, the mechanical portion of the hard disk drive can be reduced and additional revolutions per minute (RPM) can be achieved. For example, it is not uncommon for a hard disk drive to reach speeds of 15,000 RPM. This second refinement provides weight and size reductions to the hard disk drive and increases the linear density of information per track. Increased rates of revolution also provide a faster read and write rate for the disk and decrease the latency, or time required for a data area to become located beneath a head, thereby providing increased speed for accessing data. The increase in data acquisition speed due to the increased RPM of the disk drive and the more efficient read/write head portion provide modern computers with hard disk speed and storage capabilities that are continually increasing.

A wafer is a basic "building block" upon which numerous processing actions take place to produce semiconductor devices. Wafers also form a similar building block for the production of magnetic read and/or write heads and disks as used in hard disk drives. The production of such devices can comprise many different processing steps. It is not uncommon for hundreds of operations to be performed on wafers. Frequently, such production processes require that wafers be moved from one machine to another. Generally, wafers are grouped together for such transport between machines or storage. Wafers are typically moved among a variety of wafer processing equipment in carriers known as cassettes. Sometimes such a cassette is also known as a "boat."

A cassette is generally constructed from an engineering plastic. It typically comprises a plurality of slots that support and isolate each wafer. A cassette may hold up to about two dozen wafers, sometimes more. Although there are a variety of styles of cassettes available from a variety of manufacturers, a cassette is typically closed on top and bottom surfaces and closed on three sides. A fourth side is typically open, allowing for individual wafers to be moved in and out of the cassette by wafer processing equipment.

Cassettes are typically hand carried into an acceptance port of wafer processing equipment. Frequently, such an acceptance port can comprise an elevator that lowers the cassette into the wafer processing equipment for automated processing. Generally, a robotic arm grasps a single wafer, removes the wafer from the cassette and places the wafer into a load station of the wafer processing equipment for processing.

Unfortunately, wafers sometimes do not maintain a desired alignment within a cassette. For example, various handling operations, e.g., a "bump," of a cassette can dislodge one or more wafers from their desired position within the cassette. In addition, errors by automated wafer handling equipment can sometimes incorrectly place a wafer into a cassette. Further, robotic arms can incorrectly position wafers within the wafer processing equipment, e.g., a load station. For example, a wafer can have an unexpected adhesion to a robotic arm. When released from the robotic arm, such an adhesion can cause a wafer to fall into an incorrect position within the wafer processing equipment.

Such misaligned wafers can frequently cause a processing disruption at a subsequent processing stage. For example, a wafer that is misaligned in a cassette can be incorrectly accessed by a robotic arm. Such an incorrect access can result in incorrect placement of a wafer within the processing device. Alternatively, various positioning errors can result due to a transfer from a wafer carrier to the wafer processing equipment. Typically, after a time-out interval, the processing device will detect the incorrect placement of the wafer and reject that wafer. A common response to such a situation stops production flow and requires manual intervention to restore normal production. Manual intervention is not only costly in terms of direct costs and production delays, but further has the potential to introduce deleterious contamination onto the wafer and/or into the processing equipment. Contamination thus introduced can result in defects that have a detrimental effect upon production yield. In some cases, such defects may not be detected until much later in a production process.

Accordingly, there is a need for systems and methods for aligning wafers within wafer processing equipment. Additionally, in conjunction with the aforementioned need, systems and methods for automatically aligning wafers within wafer processing equipment while minimizing contamination opportunities and rinsing wafers are desired. A further need, in conjunction with the aforementioned needs, is for aligning wafers within wafer processing equipment in a manner that is compatible and complimentary with existing wafer processing systems and manufacturing processes.

SUMMARY

Systems and methods for aligning wafers within wafer processing equipment are disclosed. In a first embodiment, a wafer alignment nozzle comprises a fixed cylindrical member. A moveable cylindrical member is disposed with the fixed cylindrical member in a sliding fit. The moveable cylindrical member comprises a plurality of angled fluid orifices for directing a plurality of streams of the fluid onto a surface of the wafer.

BEST MODES FOR CARRYING OUT THE INVENTION

Figure 1:
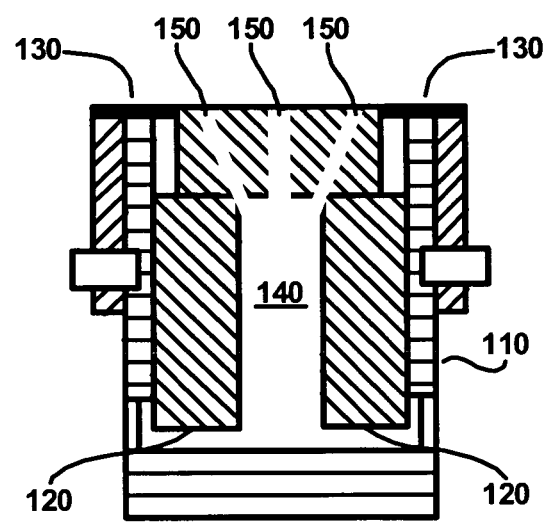
FIG. 1 illustrates a side-sectional view of a wafer alignment nozzle, in accordance with embodiments of the present invention.

Reference will now be made in detail to the alternative embodiment(s) of the present invention, system and method for aligning wafers within wafer processing equipment. While the invention will be described in conjunction with the alternative embodiment(s), it will be understood that they are not intended to limit the invention to these embodiments. On the contrary, the invention is intended to cover alternatives, modifications and equivalents, which may be included within the spirit and scope of the invention as defined by the appended claims.

Some portions of the detailed descriptions that follow (e.g., method 400) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "placing" or "moving" or "determining" or "calculating" or "delaying" or "measuring" or "terminating" or "initiating" or "locating" or "indicating" or "transmitting" or "receiving" or "advancing" or "comparing" or "processing" or "computing" or "translating" or "determining" or "excluding" or "displaying" or "recognizing" or "generating" or "assigning" or "initiating" or "collecting" or "transferring" or "switching" or "accessing" or "retrieving" or "receiving" or "issuing" or "measuring" or "conveying" or "sending" or "dispatching" or "advancing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

System and Method for Aligning Wafers within Wafer Processing Equipment

FIG. 1 illustrates a side-sectional view of a wafer alignment nozzle 100, in accordance with embodiments of the present invention. Wafer alignment nozzle 100 can be constructed from a variety of materials. However, embodiments of the present invention should be made from materials that are chemically compatible with wafers, processing equipment and processing chemicals, and do not readily contribute contaminants, e.g., via outgassing or flaking, to the processing environment. For example, embodiments of the present invention are well suited to the use of polypropylene plastic.

Wafer alignment nozzle 100 comprises a fixed cylinder 110. Fixed cylinder 110 is closed at the bottom. Within fixed cylinder 110 is a moveable cylinder 120. The outer walls of moveable cylinder 120 form a sliding fit within fixed cylinder 110. More particularly, moveable cylinder 120 is able to slide within fixed cylinder 110 along a common cylindrical axis. Moveable cylinder 120 can comprise a variety of exterior features that can deviate from a true cylindrical exterior shape. For example, moveable cylinder 120 can comprise a decreased diameter near the top of moveable cylinder 120 to interact with optional flange 130.

An optional flange 130 or other mechanism within wafer alignment nozzle 100 can limit the travel of moveable cylinder 120 within fixed cylinder 110 such than moveable cylinder 120 does not exit fixed cylinder 110.

Figure 2:
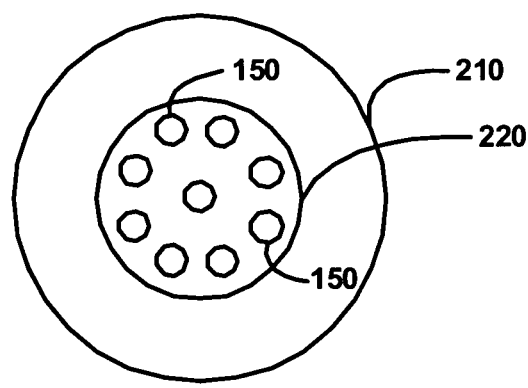
FIG. 2 illustrates a top view of a moveable cylinder, in accordance with embodiments of the present invention.

FIG. 2 illustrates a top view of moveable cylinder 120, in accordance with embodiments of the present invention. As described with respect to FIG. 1 above, moveable cylinder 120 comprises a plurality of angled fluid orifices 150. Moveable cylinder 120 comprises a top portion 220 and a bottom portion 210. Top portion 220 extends above and beyond fixed cylinder 110 (FIG. 1), while bottom portion 210 remains within fixed cylinder 110.

Under the conventional art, water flows through and out of a central fluid passage of a nozzle, impinging upon the underside of a wafer. Unfortunately, because the water is discharged through a single orifice, the area of a wafer supported by the water stream is limited to a small central area of the wafer. This can lead to a tendency of a wafer to tip, and lead to incorrect wafer positioning.

A common working fluid utilized to support and/or rinse a wafer is deionized water. In many wafer processing facilities, municipal water is processed to produce deionized water. The deionized water is generally distributed to a variety of wafer processing equipment. Use of a relatively wide single orifice nozzle of the conventional art has frequently required pressure-boosting devices installed in wafer processing equipment to supply sufficient pressure of deionized water in order to lift a wafer. Such pressure-boosting devices are expensive and the industry highly desires to eliminate such need.

In addition, it is known and generally desirable for the deionized water to rinse a wafer, thus removing contaminates. Once again, sufficient deionized water pressure is required to rinse a wafer to the extent of its edges. Once again, a relatively wide single orifice nozzle of the conventional art generally requires undesired pressure-boosting devices installed in wafer processing equipment.

Further, it has been reported that deionized water impinging a wafer at substantially 90 degrees can create static electrical activity, potentially resulting in deleterious electrostatic discharge (ESD) damage to the wafer.

Referring now to both FIG. 1 and FIG. 2, in accordance with embodiments of the present invention, moveable cylinder 120 comprises central fluid passage 140 and a plurality of angled fluid orifices 150. The plurality of angled fluid orifices 150 are set at about 45 degrees to the central axis of moveable cylinder 120. It is to be appreciated that a wide variety of angles for plurality of angled fluid orifices 150 are well suited to embodiments of the present invention. It is to be further appreciated that plurality of angled fluid orifices 150 may comprise a plurality of angles, in accordance with embodiments of the present invention. For example, a first angled fluid orifices can be constructed at an angle of 30 degrees from the central axis of moveable cylinder 120, while a second angled fluid orifice within the same moveable cylinder 120 can be constructed at an angle of 60 degrees from the central axis of moveable cylinder 120. Moveable cylinder 120 may further comprise a plurality of fluid orifices that are substantially parallel with a central axis of moveable cylinder 120.

In accordance with embodiments of the present invention, the total cross sectional area of angled fluid passages 150 should be less than the cross sectional area of central fluid passage 140.

Advantageously, in accordance with embodiments of the present invention, a fluid under pressure, for example, deionized water, enters fixed cylinder 110 through a plurality of ports (not shown). The fluid enters central fluid passage 140 and is restricted upon entering plurality of angled fluid orifices 150. Such restriction serves to reduce the volume of fluid flow while maintaining fluid pressure. As a beneficial result of such novel restriction, pressure-boosting devices generally required when using conventional art nozzles are not required with wafer alignment nozzle 100. Fluid pressure acting upon the bottom of moveable cylinder 120 and/or upon the top of central fluid passage 140 causes moveable cylinder 120 to rise.

Also of great advantage, plurality of angled fluid orifices 150 spray fluid in an angled or "fan" pattern, increasing the area of a wafer impinged by water, enabling a large base of support for the wafer. The larger area of fluid contact, in comparison with the conventional art, provides superior, e.g., more stable, support for a wafer, and can support a wafer with decreased fluid pressure. Additionally, because the fluid impinges a wafer at an angle that is not perpendicular to the wafer surface, e.g., 45 degrees, exposure to electrostatic discharge (due to use of deionized water) can be lessened.

A further advantage of wafer alignment nozzle 100 in comparison to the conventional art occurs in the rinse characteristics of the angled fluid streams. Because of their angular nature, such angled fluid streams more readily rinse to the edge of a wafer, even at lower pressure, than under the conventional art. Further, because such angled fluid streams are more closely parallel to the wafer surface being washed, any given contaminant is more readily removed by angled fluid streams in accordance with embodiments of the present invention than under the conventional art.

In accordance with one embodiment of the present invention, moveable cylinder 120 is characterized as having a bottom diameter (bottom portion 210 of FIG. 2) of about 2 cm. The top section or shoulder of moveable cylinder 120 (top portion 220 of FIG. 2) is about 1 cm. The diameter of the top of moveable cylinder 120 is about 1.6 cm. Moveable cylinder 120 is about 2.5 cm in height.

Figure 3:
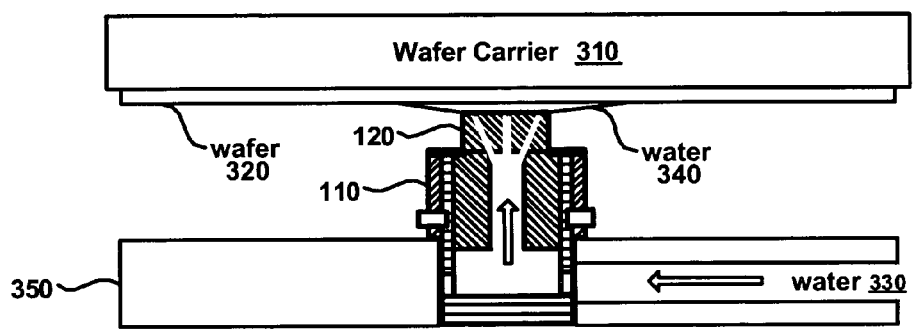
FIG. 3 illustrates an action of a nozzle supporting and rinsing a wafer, in accordance with embodiments of the present invention.

FIG. 3 illustrates an action of a nozzle supporting and rinsing a wafer, in accordance with embodiments of the present invention. Wafer alignment nozzle 100 is installed within wafer processing equipment 350, e.g., a load station. Water 330, e.g., water that has been deionized and purified, enters fixed cylinder 110 of wafer alignment nozzle 100 under pressure. It is to be appreciated that typically such water pressure can be appreciably less than water pressure required under the conventional art. More particularly, in accordance with embodiments of the present invention, water pressure boosting devices within wafer processing equipment may not be required.

Water 330 interacts with the bottom of moveable cylinder 120 and with the restriction at the top of moveable cylinder 120 (FIG. 1). Water 330 lifts moveable cylinder 120 of wafer alignment nozzle 100. Water 330 is forced through angled fluid orifices 150 (FIGS. 1, 2 and 3) to form water spray 340. Water spray 340 supports and pushes wafer 320 up until it engages wafer carrier 310. Wafer carrier 310 typically utilizes a vacuum to retain a wafer, e.g., wafer 320.

In accordance with embodiments of the present invention, water spray 340 also rinses wafer 320.

It is to be appreciated that embodiments in accordance with the present invention are further well suited to lowering a wafer from wafer carrier 310. For example, water spray 340 can support wafer 320 in a similar fashion as previously described. Wafer carrier 310 can remove or reduce a vacuum that retains wafer 320. Water 330 pressure and/or flow can be gradually decreased. In response, moveable cylinder 120 will be lowered into a resting position, and wafer 320 will be lowered, e.g., into a load station.

Water spray 340 offers numerous advantages in comparison to the conventional art. For example, water spray 340 supports wafer 320 over a wider area than a conventional art spray, beneficially providing better support of a wafer at lower water pressures. In addition, water spray 340 is more effective at cleansing a wafer, as water spray 340 is characterized as having a significant flow vector component parallel to a surface of a wafer. Such a flow vector component parallel to a surface of a wafer is much more effective at cleansing than a substantially perpendicular flow provided under the conventional art. Further, water flowing with a signification vector component parallel to a surface of a wafer is less likely to induce deleterious electrostatic discharge events than a substantially perpendicular flow provided under the conventional art.

Figure 4:
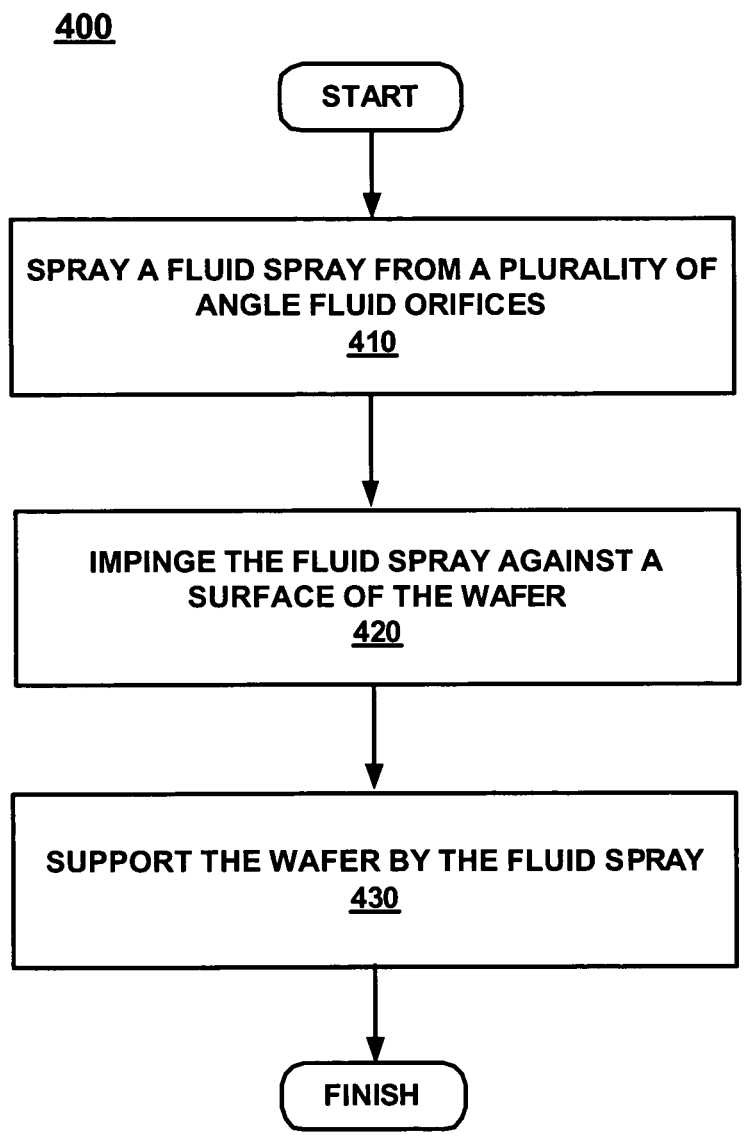
FIG. 4 is a flow chart for a method of supporting a wafer within wafer processing equipment, in accordance with embodiments of the present invention.

FIG. 4 is a flow chart for a method 400 of supporting a wafer within wafer processing equipment, in accordance with embodiments of the present invention. In 410, a fluid spray is sprayed from a plurality of angled fluid orifices. For example, the fluid is sprayed from plurality of angled fluid orifices 150 (FIG. 1).

Referring once again to FIG. 4, in 420, the fluid spray impinges against a surface of the wafer. In 430, the wafer is supported by the fluid spray. The fluid spray comprises a flow component parallel to the surface of the wafer. For example, the fluid spray is not directed at the wafer perpendicular to the surface of the wafer.

In accordance with embodiments of the present invention, the fluid can be water. A use of water to support a wafer is further advantageous in that a supporting water spray can beneficially rinse, e.g., clean, the surface of the wafer. In accordance with other embodiments of the present invention, method 400 can be utilized to raise and/or lower a wafer. For example, to raise a wafer, e.g., out of a load station, a combined force of the sprayed fluid should be greater than the weight of the wafer. Alternatively, to lower a waver, a combined force of the sprayed fluid should be less than the weight of the wafer.

In accordance with still other embodiments of the present invention, the plurality of angled fluid orifices can comprise orifices at different angles relative to the surface of the wafer. For example, a first fluid orifice can be set at a first angle to the surface of a wafer, e.g., 30 degrees, and a second fluid orifice can be set at a second angle to the surface of a wafer, e.g., 60 degrees.

In accordance with still yet other embodiments of the present invention, the impinging water spray impinges an area on the surface of the wafer that is substantially greater than a minimum area enclosing the plurality of angled fluid orifices. For example, the fluid is sprayed in an "outward" direction from the plurality of angled fluid orifices. Such a greater area of support of a wafer is beneficially more stable, and can support and/or lift a wafer with less fluid pressure than under the conventional art.

Thus, embodiments of the present invention provide an apparatus and method for aligning wafers within wafer processing equipment. Additionally, embodiments provide a method and system for automatically aligning wafers within wafer processing equipment while minimizing contamination opportunities and rinsing wafers. Embodiments of the present invention further provide for in a manner that is compatible and complimentary with existing wafer processing systems and manufacturing processes.

While the method of the embodiment illustrated in flow chart 400 shows specific sequences and quantity of operations, the present invention is suitable to alternative embodiments. For example, not all the operations provided for in the methods are required for the present invention. Furthermore, additional operations can be added to the operations presented in the present embodiment. Likewise, the sequences of operations can be modified depending upon the application.

Embodiments in accordance with the present invention, system and method for aligning wafers within wafer processing equipment, are thus described. While the present invention has been described in particular embodiments, it should be appreciated that the present invention should not be construed as limited by such embodiments, but rather construed according to the below claims.

What is claimed is:

1. A method for supporting a wafer within wafer processing equipment comprising:
    flowing a fluid under pressure from a central fluid passage through a plurality of angled fluid orifices, wherein a total cross sectional area of said plurality of angled fluid orifices is less than a total cross sectional area of said central fluid passage, reduction in said total cross sectional area from the central fluid passage to the total cross sectional area of the plurality of angled fluid orifices causing an increase in pressure of said fluid flowing through said plurality of angled fluid orifices such that a pressure-boosting device is not required for said angled fluid orifices;
    spraying a fluid spray from said plurality of angled fluid orifices wherein at least a first of said plurality of angled fluid orifices is angled at 30 degrees relative to a central axis of a wafer processing equipment and at least a second of said plurality of angled fluid orifices is angled at 60 degrees relative to the central axis of the wafer processing equipment;
    impinging said fluid spray against a surface of said wafer;
    supporting said wafer with said fluid spray;
    wherein said fluid spray comprises a flow component parallel to said surface of said wafer, said flow component directed away from said central axis of said wafer processing equipment and towards the edges of said wafer; and
    wherein a first force of said fluid spray exerted upon said wafer is greater than a weight of said wafer to raise said wafer out of a load station.

2. The method of claim 1 wherein said fluid is water.

3. The method of claim 1 wherein a second force of said fluid spray exerted upon said wafer is less than a weight of said wafer to lower the wafer into a load station.

4. The method of claim 1 wherein said impinging further rinses said surface of said wafer.

5. The method of claim 1 wherein said impinging comprises an area on said surface of said wafer substantially greater than a minimum area enclosing said plurality of angled fluid orifices.

\* \* \* \* \*